United States Patent
Jo et al.

(10) Patent No.: US 11,121,188 B2
(45) Date of Patent: Sep. 14, 2021

(54) ORGANIC LIGHT-EMITTING DISPLAY APPARATUS AND METHOD OF MANUFACTURING THE SAME

(71) Applicant: SAMSUNG DISPLAY CO., LTD., Yongin-si (KR)

(72) Inventors: Kangmoon Jo, Yongin-si (KR); Dongwoo Kim, Yongin-si (KR); Youngmin Kim, Yongin-si (KR); Sungjae Moon, Yongin-si (KR); Kisoo Park, Yongin-si (KR); Junhyun Park, Yongin-si (KR); Ansu Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/593,570

(22) Filed: Oct. 4, 2019

(65) Prior Publication Data

US 2020/0194503 A1    Jun. 18, 2020

(30) Foreign Application Priority Data

Dec. 12, 2018    (KR) ........................ 10-2018-0160340

(51) Int. Cl.
*H01L 27/32*    (2006.01)
*H01L 51/52*    (2006.01)
*H01L 51/56*    (2006.01)

(52) U.S. Cl.
CPC ........ *H01L 27/322* (2013.01); *H01L 27/3211* (2013.01); *H01L 27/3262* (2013.01); *H01L 51/5253* (2013.01); *H01L 51/5284* (2013.01); *H01L 51/56* (2013.01)

(58) Field of Classification Search
CPC ... H01L 27/322; H01L 51/56; H01L 51/5253; H01L 51/5284; H01L 27/3211; H01L 27/3258; H01L 27/3262
See application file for complete search history.

(56) References Cited

U.S. PATENT DOCUMENTS

| 10,197,844 B2 | 2/2019 | Lee et al. |
| 2018/0061314 A1 | 3/2018 | Kim |
| 2018/0156951 A1* | 6/2018 | Baek ............... G02B 5/285 |

FOREIGN PATENT DOCUMENTS

| JP | 2015-220215 | 12/2015 |
| JP | 2015220215 A | * 12/2015 |
| KR | 10-2017-0062707 | 6/2017 |
| KR | 10-2018-0024910 | 3/2018 |
| KR | 10-2018-0044474 | 5/2018 |

* cited by examiner

*Primary Examiner* — Steven H Loke
*Assistant Examiner* — Juanita B Rhodes
(74) *Attorney, Agent, or Firm* — F. Chau & Assoicates, LLC (57) ABSTRACT

An organic light-emitting display apparatus includes a display layer including a first non-light-emitting area in which a pixel-defining layer surrounding a light-emitting area is arranged, and a second non-light-emitting area further including a spacer on the pixel-defining layer; a light shield layer including a first black matrix and a second matrix covering the first non-light-emitting area and the second non-light-emitting area, respectively, and having different dielectric constants; and a touchscreen electrode including a touch electrode on a position corresponding to the first black matrix and the second matrix.

13 Claims, 9 Drawing Sheets

ORGANIC LIGHT-EMITTING DISPLAY APPARATUS AND METHOD OF MANUFACTURING THE SAME

CROSS-REFERENCE TO RELATED APPLICATION

This application claims priority under 35 U.S.C. § 119 from, and the benefit of, Korean Patent Application No. 10-2018-0160340, filed on Dec. 12, 2018 in the Korean Intellectual Property Office, the contents of which are herein incorporated by reference in their entirety.

BACKGROUND

1. Technical Field

One or more embodiments are directed to an organic light-emitting display apparatus and a method of manufacturing the same, and more particularly, to an organic light-emitting display apparatus that use a quantum-dot thin-film layer and a method of manufacturing the organic light-emitting display apparatus.

2. Discussion of the Related Art

In general, an organic light-emitting display apparatus generates an image by emitting light based on a principle in which a hole and an electron injected from an anode and a cathode, respectively, recombine with each other in an organic emission layer. For example, an organic light-emitting display apparatus includes pixels that emit red, green or blue light and combines the colored lights with each other to thereby represent a desired color.

To do so, each of the pixels includes an organic light-emitting diode that emits monochromatic light such as white light or blue light, and a quantum-dot thin-film layer and a color filter layer, which are light coloration units that convert the monochromatic light into a desired color, such as red, green, or blue light, to thereby emit light. That is, when the organic light-emitting diode of each of the pixels generates monochromatic light, as the monochromatic light passes through the quantum-dot thin-film layer and the color filter, the monochromatic light is converted into red, green or blue light to thereby emit colored light. As such, an image with a desired color can be implemented by combining colors of each of the pixels with each other.

SUMMARY

Between an organic light-emitting diode and a light coloration unit, a filler is used to maintain a space between the organic light-emitting diode and the light coloration unit. When the space is large, a phenomenon occurs in which light generated by the organic light-emitting diode is emitted via not only that pixel's light coloration unit, but also another pixel's light coloration unit. Then, a desired accurate color may not be generated but rather an image with unintentionally mixed colors is generated. As a result, a product defect can occur.

One or more embodiments include an organic light-emitting display device enhanced to effectively suppress unintentional color mixing between adjacent pixels, and a method of manufacturing the organic light-emitting display apparatus.

Additional aspects will be set forth in part in the description which follows and, in part, will be apparent from the description, or may be learned by practice of the disclosed embodiments.

According to one or more embodiments, an organic light-emitting display apparatus includes a first substrate on which a plurality of organic light-emitting diodes are disposed; a second substrate bonded to the first substrate by a sealant and on which are disposed a plurality of light coloration units respectively corresponding to the plurality of organic light-emitting diodes; and a plurality of gap maintainers disposed between the plurality of organic light-emitting diodes and the plurality of light coloration units and that maintain a space between the first substrate and the second substrate.

Each of the gap maintainers may include a spacer disposed between the plurality of organic light-emitting diodes and that protrudes toward the second substrate, and an over-coating layer disposed between the plurality of light coloration units and that contact the spacers.

The organic light-emitting display apparatus may further include a thin-film encapsulation layer that covers the plurality of organic light-emitting diodes, wherein the spacers are disposed on the thin-film encapsulation layer.

The thin-film encapsulation layer may not directly contact the plurality of light coloration units.

The organic light-emitting display apparatus may further include an inorganic layer disposed on an inner surface of the second substrate, wherein the over-coating layers are disposed on the inorganic layer.

The gap maintainers may include an opaque material.

The organic light-emitting display apparatus may further include a filler disposed between the plurality of organic light-emitting diodes and the plurality of light coloration units.

Each of the plurality of organic light-emitting diodes may generate a monochromatic light of a same color.

The monochromatic light may include one of white light or blue light.

Each of the plurality of light coloration units may each include a quantum-dot thin-film layer that faces the plurality of organic light-emitting diodes, and a color filter layer disposed between the second substrate and the quantum-dot thin-film layer. The quantum-dot thin-film layer and the color filter layer may color the monochromatic light generated by the plurality of organic light-emitting diodes into red, green or blue light The organic light-emitting display apparatus may further include a black matrix disposed between the light coloration units of the second substrate, where the black matrix blocks light transmission.

According to one or more embodiments, a method of manufacturing an organic light-emitting display apparatus includes forming a plurality of organic light-emitting diodes on a first substrate, wherein each of the plurality of organic light-emitting diodes generates monochromatic light of a same color forming a plurality of spacers between the plurality of organic light-emitting diodes on the first substrate; forming a plurality of light coloration units on a second substrate and in correspondence with the plurality of organic light-emitting diodes; forming a plurality of over-coating layers between the plurality of light coloration units of the second substrate and in correspondence with the plurality of spacers; and contacting the spacers with the over-coating layers by bonding the first substrate to the second substrate with a sealant.

The method may further include forming a thin-film encapsulation layer that covers the plurality of organic light-emitting diodes, wherein the plurality of spacers are disposed on the thin-film encapsulation layer The spacers and the over-coating layers may include opaque materials.

An air gap may be formed between the plurality of organic light-emitting diodes and the plurality of light coloration units.

The method may further comprise inserting a filler between the plurality of organic light-emitting diodes and the plurality of light coloration units.

Forming the plurality of light coloration units may include forming a plurality of color filter layers on the second substrate; forming a black matrix between the plurality of color filter layers of the second substrate; forming an inorganic layer that covers the plurality of color filter layers and the black matrix; and forming a plurality of quantum-dot thin-film layers on the inorganic layer and in correspondence with the plurality of color filter layers, wherein the over-coating layers may be disposed on the inorganic layer.

The plurality of quantum-dot thin-film layers and the plurality of color filter layers may color monochromatic light generated by the plurality of organic light-emitting diodes into red, green or blue light.

According to one or more embodiments, an organic light-emitting display apparatus includes a first substrate on which a plurality of organic light-emitting diodes are disposed, where each of the plurality of organic light-emitting diodes generate a monochromatic light of a same color, a second substrate bonded to the first substrate by a sealant, and a plurality of gap maintainers disposed between the plurality of organic light-emitting diodes that maintain a space between the first substrate and the second substrate. Each of the plurality of gap maintainers includes a spacer disposed between the plurality of organic light-emitting diodes and that protrudes toward the second substrate, and an over-coating layer disposed directly on the spacer.

The organic light-emitting display apparatus may further comprise a plurality of light coloration units disposed on the second substrate that respectively correspond to the plurality of organic light-emitting diodes. Each of the plurality of light coloration units may include a quantum-dot thin-film layer that faces the plurality of organic light-emitting diodes, and a color filter layer disposed between the second substrate and the quantum-dot thin-film layer, where the quantum-dot thin-film layer and the color filter layer color the monochromatic light generated by the plurality of organic light-emitting diodes into red, green or blue light.

In addition to those described above, other aspects, features and effects will become apparent from the following drawings, claims, and detailed descriptions of the present disclosure.

DETAILED DESCRIPTION

Reference will now be made in detail to exemplary embodiments, examples of which are illustrated in the accompanying drawings, wherein like reference numerals may refer to like elements throughout. In this regard, exemplary embodiments may have different forms and should not be construed as being limited to the descriptions set forth herein. Accordingly, exemplary embodiments are merely described below, by referring to the figures, to explain aspects of the present disclosure.

As the present disclosure allows for various changes and numerous embodiments, exemplary embodiments will be illustrated in the drawings and described in detail in the written description. Effects and features of the present disclosure and a method of achieving the same will become apparent to those skilled in the art from the following detailed description which discloses exemplary embodiments in conjunction with the accompanying drawings. The present disclosure may, however, be embodied in many different forms and should not be construed as being limited to the embodiments set forth herein.

Hereinafter, exemplary embodiments will be described in detail with reference to the accompanying drawings. Like reference numerals in the drawings may denote like elements, and thus their descriptions may be omitted.

Sizes of elements in the drawings may be exaggerated for convenience of explanation.

It will be understood that when a layer, region, or component is referred to as being "connected to" or "coupled to" another layer, region, or component, it may be "directly connected or coupled" to the other layer, region, or component, or "indirectly connected to" the other layer, region, or component with intervening elements therebetween.

Figure 1:
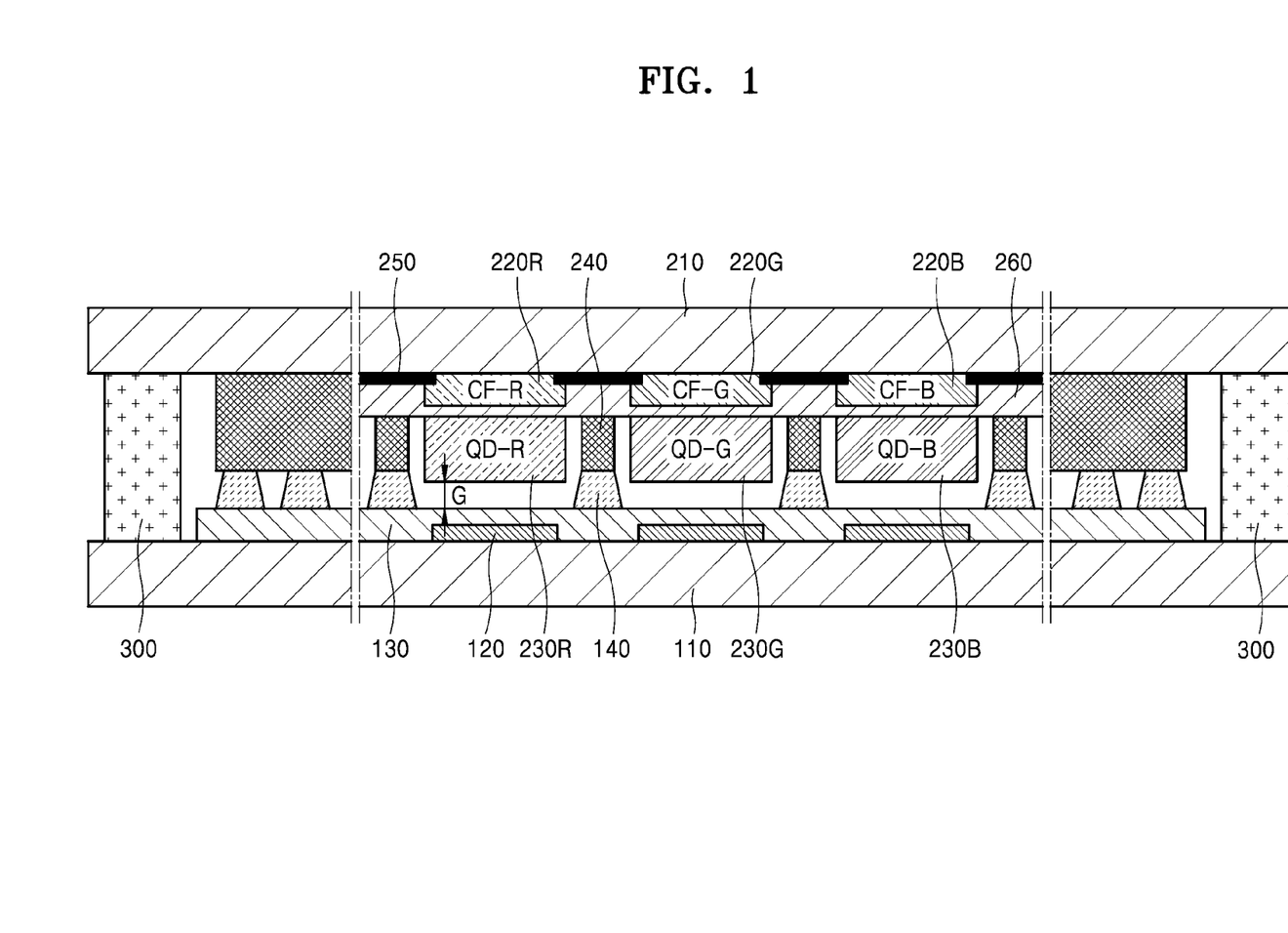
FIG. 1 is a cross-sectional view of an organic light-emitting display apparatus according to an embodiment.

FIG. 1 is a cross-sectional view of an organic light-emitting display apparatus according to an embodiment. FIG. 1 shows a set of red, green and blue pixels. However, it may be understood that a plurality of sets of colored pixels are present in a product.

As shown in the drawing, in a present embodiment, an organic light-emitting display apparatus includes a first substrate 110 bonded to a second substrate 210 by a sealant 300, in which a plurality of organic light-emitting diodes 120 are disposed on the first substrate 110, and a plurality of light coloration units such as quantum-dot thin-film layers 230R, 230G, and 230B and color filter layers 220R, 220G, and 220B are disposed on the second substrate 210.

Figure 2:
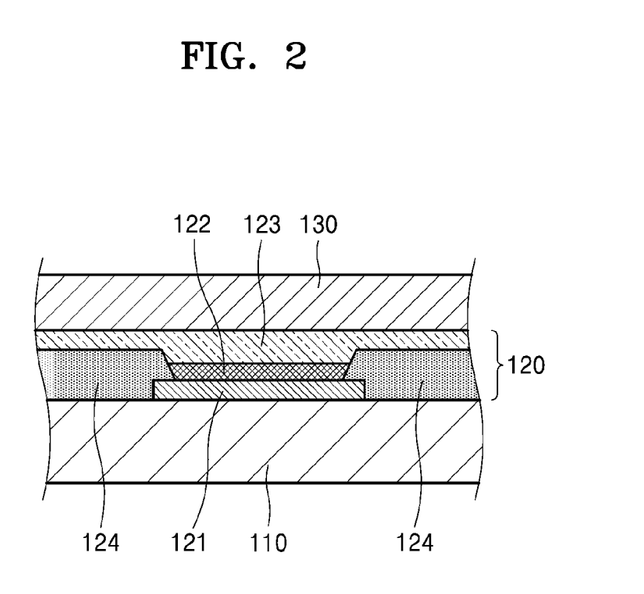
FIG. 2 is a magnified cross-sectional view of an internal structure of an organic light-emitting diode of FIG. 1.

As shown in FIG. 2, in a present embodiment, the organic light-emitting diodes 120 include an organic emission layer 122 disposed between an anode electrode 121 and a cathode electrode 123. The organic light-emitting diodes 120 generate light when a hole and an electron respectively injected from the anode electrode 121 and the cathode electrode 123 recombine with each other in the organic emission layer 122 to thereby emit light. Reference numeral 124 denotes an insulating layer. The light generated by the organic light-emitting diodes 120 is monochromatic light such as white light or blue light. The red, green and blue pixels generate monochromatic light of a same color. That is, the organic light-emitting diodes 120 generate monochromatic light, and the coloration units of each of the pixels convert the monochromatic light into a red, green, or blue color. Reference numeral 130 denotes a thin-film encapsulation layer that protects the organic light-emitting diodes 120 by covering the organic light-emitting diodes 120. The thin-film encapsulation layer 130 may include a single organic or inorganic layer or include multiple layers in which an organic layer and an inorganic layer are sequentially stacked.

In a present embodiment, the light coloration units include the quantum-dot thin-film layers 230R, 230G, and 230B and the color filter layers 220R, 220G, and 220B. The quantum-dot thin-film layers 230R, 230G, and 230B convert the monochromatic light generated by the organic light-emitting diodes 120 into red, green or blue light. The color filter layers 220R, 220G, and 220B filter stray light that may be partially mixed from a conversion result, that is, red, green, or blue light. Reference numeral 250 denotes a black matrix disposed between the respective pixels and that provides a light shield. Reference numeral 260 denotes an inorganic layer that covers the color filter layers 220R, 220G, and 220B and the black matrix 250.

In a present embodiment, as a gap maintainer that maintains a proper spacing between the first substrate 110 and the second substrate 210, a plurality of spacers 140 are disposed on the thin-film encapsulation layer 130 and a plurality of over-coating layers 240 are disposed on the inorganic layer 260.

In a present embodiment, the spacers 140 and the over-coating layers 240 include opaque materials. When the first substrate 110 is bonded to the second substrate 210, the spacer 140 contacts the over-coating layer 240 to thereby maintain a gap G between the first substrate 110 and the second substrate 210. That is, instead of using a separate filler between the first and second substrates 110 and 210 to maintain a gap, the spacer 140 and the over-coating layer 240 are disposed in contact with each other between the organic light-emitting diodes 120 and between the light coloration units to maintain a gap. By doing so, the gap G can be maintained without having to use a separate filler between the first and second substrates 110 and 210. Thus, the gap G between the organic light-emitting diodes 120 and the quantum-dot thin-film layers 230R, 230G, and 230B can be reduced. When a filler is placed between the first and second substrates 110 and 210 to maintain a uniform space therebetween, a narrow space may not be maintained between the organic light-emitting diodes 120 and the quantum-dot thin-film layers 230R, 230G, and 230B of the light coloration unit. Accordingly, the gap G may be widened to at least 10 μm. Then, light generated by organic light-emitting diodes 120 propagate through not only the light coloration units disposed above the organic light-emitting diodes 120, but also through light coloration units of an adjacent pixel.

However, in a present embodiment, since the spacers 140 and the over-coating layers 240 maintain the gap G without using a filler, a space between the first and second substrates 110 and 210, in particular, the gap G between the organic light-emitting diodes 120 and the quantum-dot thin-film layers 230R, 230G, and 230B can be kept narrow, for example, to about 1 μm to about 2 μm. Thus, the amount of light generated from the organic light-emitting diodes 120 that propagates through light coloration units of an adjacent pixel can be reduced. As a result, unintentional color mixing can be sufficiently suppressed.

In addition, in a present embodiment, since the spacers 140 and the over-coating layers 240 include opaque materials, the spacers 140 and the over-coating layers 240 can function as a light shield wall. Thus, a function of preventing color mixing can be improved.

Accordingly, in a present embodiment, when an organic light-emitting display apparatus having such a structure is used, images with clean and clear colors can be displayed by suppressing color mixing between pixels.

An organic light-emitting display apparatus having a structure as described above can be manufactured by a process described with reference to FIGS. 3A to 3F.

Figure 3A:
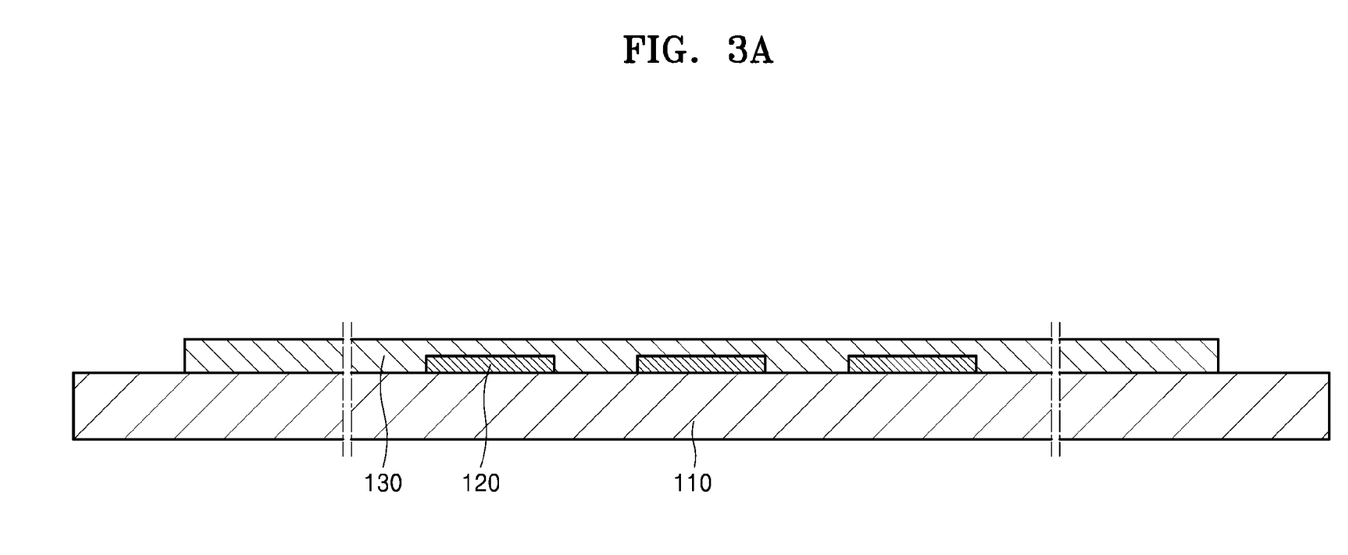
FIGS. 3A to 3F are cross-sectional views of a process of manufacturing the organic light-emitting display apparatus of FIG. 1.

As shown in FIG. 3A, in a present embodiment, the organic light-emitting diodes 120 are disposed on the first substrate 110. Then, the organic light-emitting diodes 120 are covered by the thin-film encapsulation layer 130.

Figure 3B:
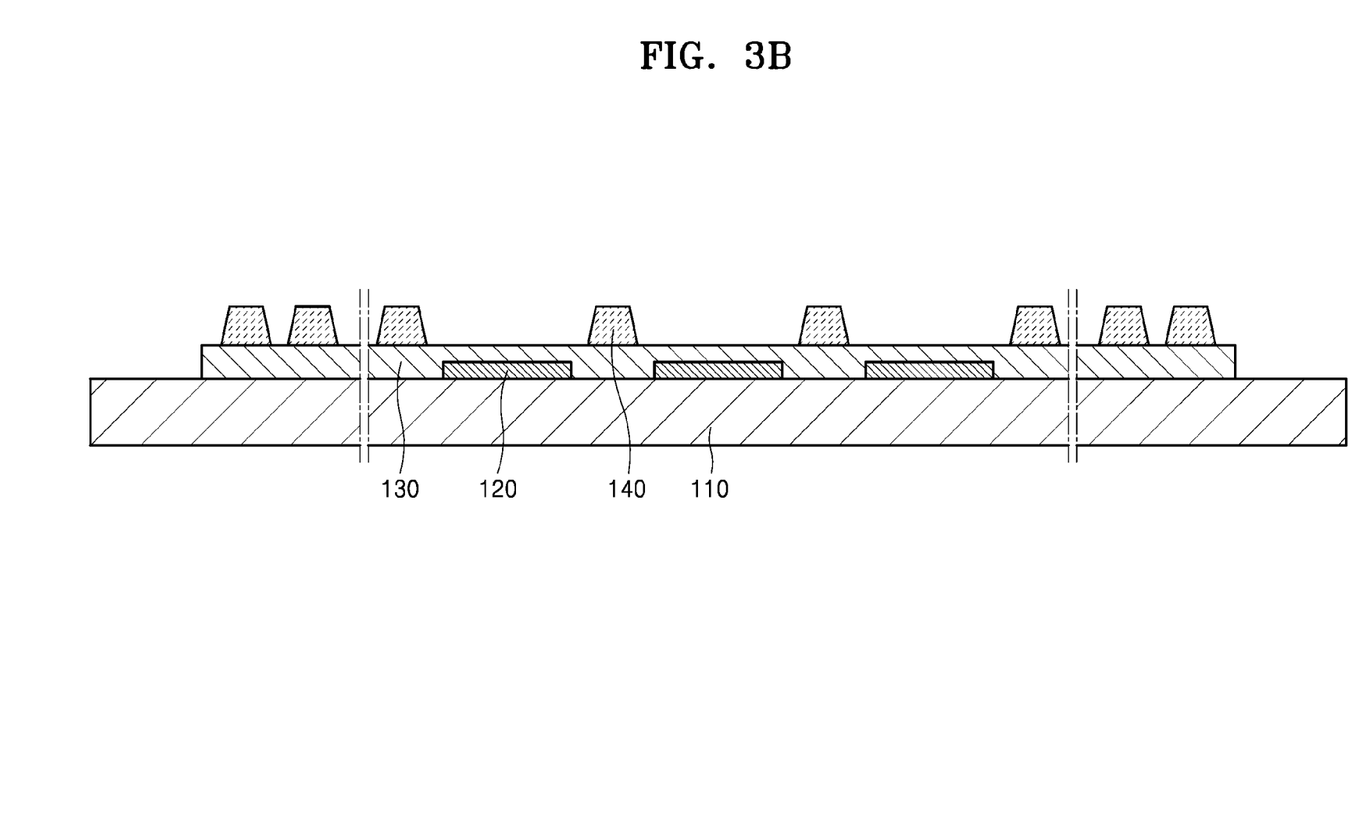

Next, in a present embodiment, as shown in FIG. 3B, the spacers 140 are formed on the thin-film encapsulation layer 130 using a photolithography process. In an image area, the spacers 140 are disposed at locations that do not overlap the organic light-emitting diodes 120, that is, between the organic light-emitting diodes 120.

Figure 3C:
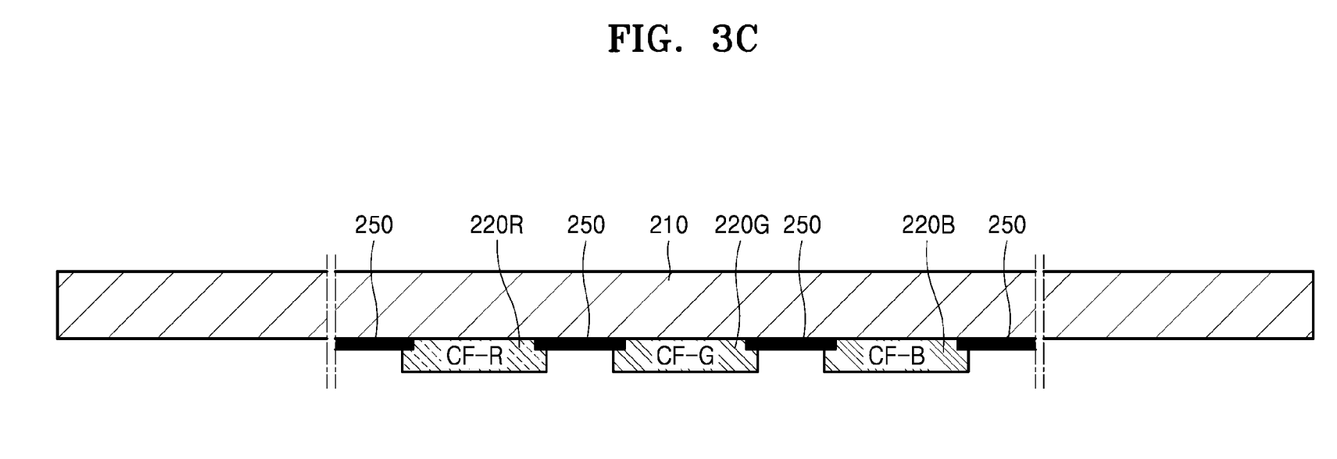

As shown in FIG. 3C, on the second substrate 210, the color filter layers 220R, 220G, and 220B and the black matrix 250 are each formed by a photolithography process.

Figure 3D:
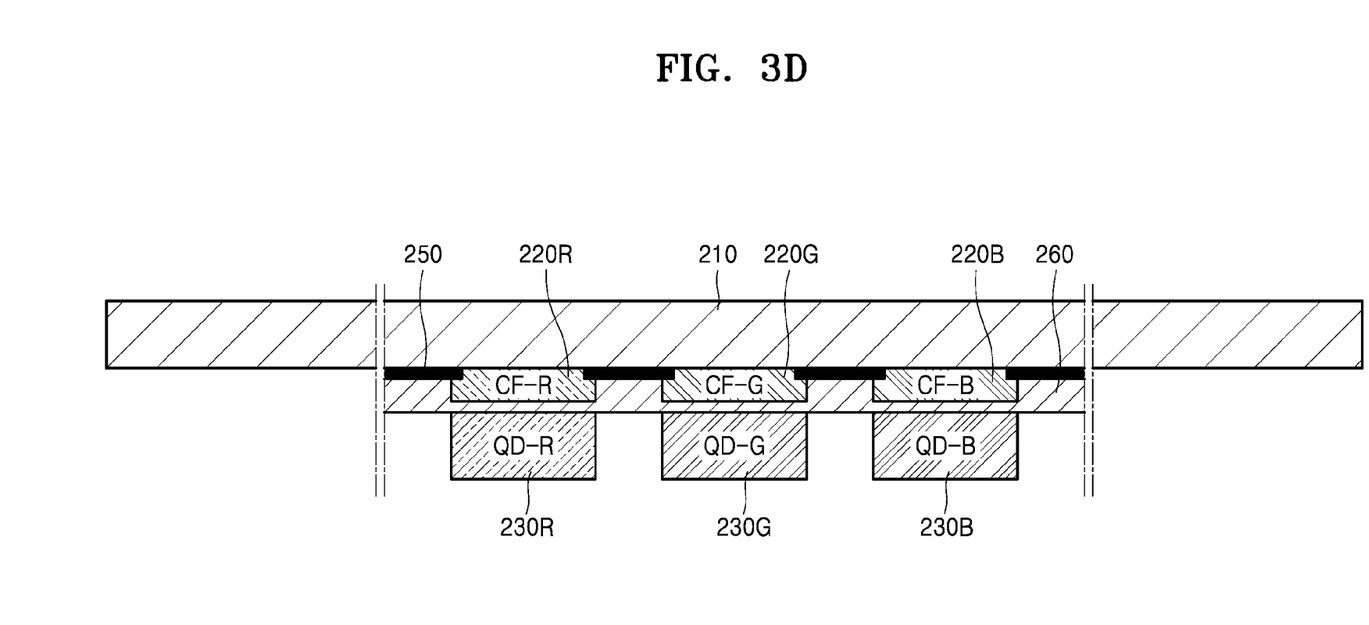

Next, as shown in FIG. 3D, in a present embodiment, the inorganic layer 260 that covers the color filter layers 220R, 220G, and 220B and the black matrix 250 is formed. On the inorganic layer 260, the quantum-dot thin-film layers 230R, 230G, and 230B are formed. The quantum-dot thin-film layers 230R, 230G, and 230B are disposed at locations that overlap the color filter layers 220R, 220G, and 220B, respectively. The color filter layers 220R, 220G, and 220B, the black matrix 250, and the quantum-dot thin-film layers 230R, 230G, and 230B can be formed, for example, by using a photolithography process or an inkjet process.

Figure 3E:
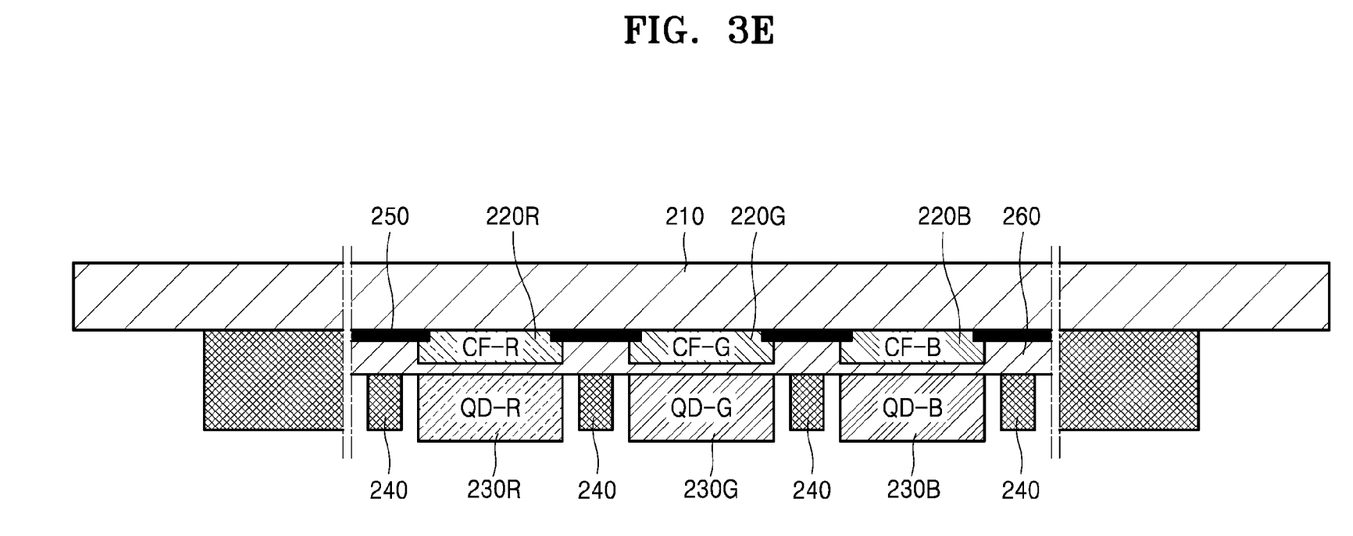

Then, in a present embodiment, as shown in FIG. 3E, on the inorganic layer 260, the over-coating layers 240 are formed. In the image area, the over-coating layers 240 are formed at locations that correspond to the spacers 140, that is, between the quantum-dot thin-film layers 230R, 230G, and 230B of the light coloration units.

Figure 3F:
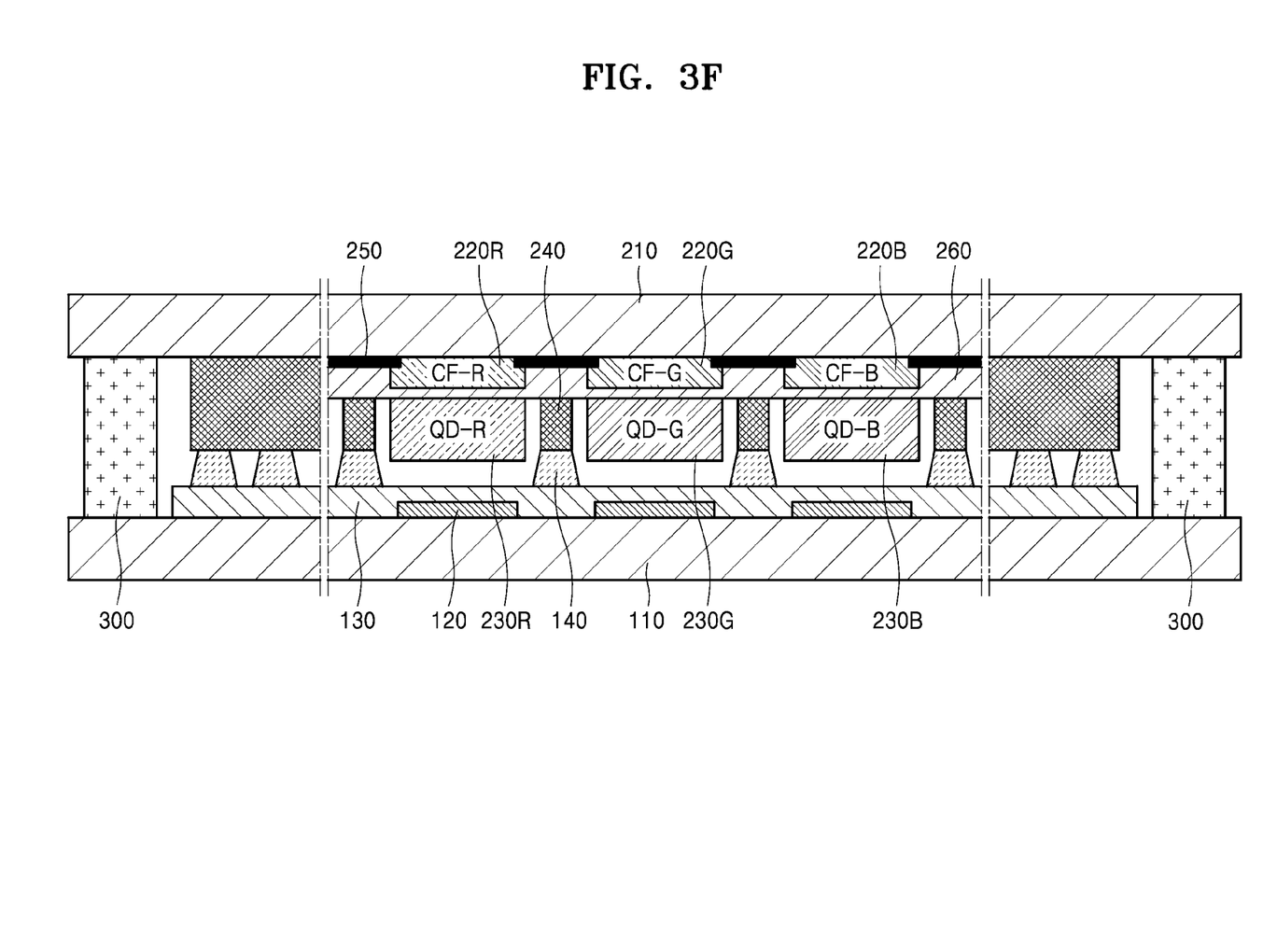

In a present embodiment, the sealant 300 is attached between the first and second substrates 110 and 210, and the first substrate 110 is bonded to the second substrate 210. Then, as shown in FIG. 3F, an organic light-emitting display apparatus is implemented so that the organic light-emitting diodes 120, the quantum-dot thin-film layers 230R, 230G, and 230B, and the color filter layers 220R, 220G, and 220B are aligned to overlap each other.

In addition, in a present embodiment, the spacer 140, the over-coating layer 240, and the black matrix 250 are aligned in positions that overlap each other. The spacer 140 and the over-coating layer 240 contact each other and function as gap maintainers. As described above, since a separate filler is not placed between the first substrate 110 and the second substrate 210, the gap G between the organic light-emitting diodes 120 and the quantum-dot thin-film layers 230R, 230G, and 230B of the light coloration units can be maintained narrow, at about 1 μm to about 2 μm. Thus, unintentional color mixing can be prevented. In addition, since the spacers 140 and the over-coating layers 240 include opaque materials, the spacers 140 and the over-coating layers 240 function as a light shield wall. Thus, an accurate color may be rendered.

Figure 4:
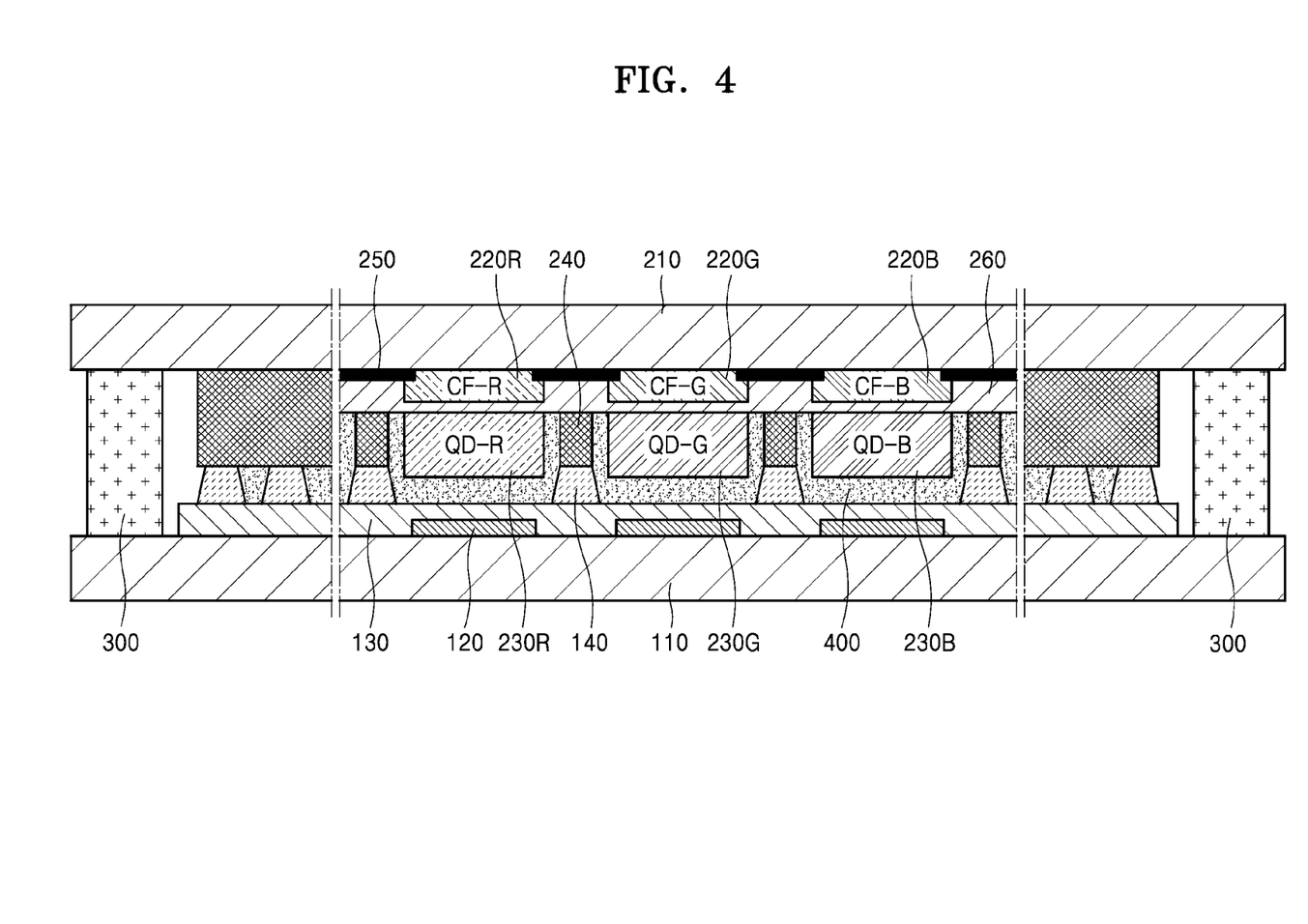
FIG. 4 is a cross-sectional view of an organic light-emitting display apparatus according to another embodiment.

In a present embodiment, a structure in which, instead of a separate filler, an air gap is present in a space between the first substrate 110 and the second substrate 210 is described as an example. In another embodiment, a filler 400 can be inserted in the space between the first and second substrates 110 and 210, as shown in FIG. 4. In this case, the filler 400 does not function as a gap maintainer, but is filled as an additional functional element, for example, such as an absorbing material. Like exemplary embodiments described above, a function of the gap maintainer can be performed by the spacers 140 and the over-coating layers 240. That is, even though a filler is not used to maintain a gap between substrates, when there is an additional demand for, e.g., an absorbing function, an empty space in the gap may be utilized.

Accordingly, in an organic light-emitting display apparatus and a method of manufacturing the same according to exemplary embodiments described above, light produced from an organic light-emitting diode of a pixel can be prevented from propagating to an adjacent pixel by reducing a gap between the organic light-emitting diodes and light coloration units. Accordingly, by using an organic light-emitting display apparatus and a method of manufacturing the same according to exemplary embodiments, color mixing between pixels can be suppressed to thereby display an image with a clean and clear color. As a resultant, the performance and reliability of a product cam be improved.

It should be understood that exemplary embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. An organic light-emitting display apparatus, comprising:
   a first substrate on which a plurality of organic light-emitting diodes are disposed;
   a second substrate bonded to the first substrate by a sealant and on which are disposed a plurality of light coloration units that respectively correspond to the plurality of organic light-emitting diodes;
   a plurality of gap maintainers disposed between adjacent organic light-emitting diodes of the plurality of organic light-emitting diodes as well as between adjacent light coloration units of the plurality of light coloration units, wherein the plurality of gap maintainers maintain a space between the first substrate and the second substrate;
   a thin-film encapsulation layer disposed between the first substrate and the plurality of gap maintainers, wherein the plurality of organic light-emitting diodes are interposed between the first substrate and the thin-film encapsulation layer, and
   wherein the thin-film encapsulation layer covers each organic light emitting diode of the plurality of organic light-emitting diodes; and
   an inorganic layer disposed on an inner surface of the second substrate and between the second substrate and the gap maintainers, wherein the gap maintainers are interposed between the thin-film encapsulation layer and the inorganic layer, and wherein at least some of the light coloration units are disposed between the inorganic layer and the second substrate.

2. The organic light-emitting display apparatus of claim 1, wherein each gap maintainer of the plurality of gap maintainers comprises
   a respective spacer disposed between adjacent organic light-emitting diodes of the plurality of organic light-emitting diodes and that protrudes toward the second substrate, and
   a respective over-coating layer disposed between adjacent light coloration units of the plurality of light coloration units and that contacts the respective spacers.

3. The organic light-emitting display apparatus of claim 2, wherein the respective spacers are disposed on the thin-film encapsulation layer.

4. The organic light-emitting display apparatus of claim 3, wherein the thin-film encapsulation layer does not directly contact the plurality of light coloration units.

5. The organic light-emitting display apparatus of claim 2, wherein the respective over-coating layers are disposed on the inorganic layer.

6. The organic light-emitting display apparatus of claim 1, wherein the plurality of gap maintainers include an opaque material.

7. The organic light-emitting display apparatus of claim 1, further comprising a filler disposed between the plurality of organic light-emitting diodes and the plurality of light coloration units.

8. The organic light-emitting display apparatus of claim 1, wherein each organic light-emitting diode of the plurality of organic light-emitting diodes generates a monochromatic light of a same color.

9. The organic light-emitting display apparatus of claim 8, wherein the monochromatic light comprises one of white light or blue light.

10. The organic light-emitting display apparatus of claim 8, wherein each light coloration unit of the plurality of light coloration units comprises
    a respective quantum-dot thin-film layer that faces respective organic light emitting diodes of the plurality of organic light-emitting diodes, and
    a respective color filter layer disposed between the second substrate and the respective quantum-dot thin-film layer,
    wherein the respective quantum-dot thin-film layer and the respective color filter layer color the monochromatic light generated by the plurality of organic light-emitting diodes into red, green or blue light, respectively.

11. The organic light-emitting display apparatus of claim 1, further comprising a black matrix disposed between adjacent light coloration units of the plurality of light coloration units on the second substrate, wherein the black matrix blocks light transmission.

12. An organic light-emitting display apparatus, comprising:
    a first substrate on which a plurality of organic light-emitting diodes are disposed, wherein each organic light-emitting diode of the plurality of organic light-emitting diodes generates a monochromatic light of a same color;
    a second substrate bonded to the first substrate by a sealant;
    a plurality of gap maintainers disposed between adjacent organic light-emitting diode of the plurality of organic light-emitting diodes, wherein the plurality of gap maintainers maintain a space between the first substrate and the second substrate,
    wherein each gap maintainer of the plurality of gap maintainers comprises
       a respective spacer disposed on the first substrate and between adjacent organic light-emitting diodes of the plurality of organic light-emitting diodes and that protrudes toward the second substrate, and an over-coating layer disposed directly on the respective spacer and between the respective spacer and the second substrate; and an inorganic layer disposed between each respective over-coating layer of the plurality of gap maintainers and an inner surface of the second substrate.

13. The organic light-emitting display apparatus of claim 12, further comprising:
a plurality of light coloration units disposed on the second substrate that respectively correspond to the plurality of organic light-emitting diodes,
wherein each light coloration unit of the plurality of light coloration units comprises
a respective quantum-dot thin-film layer that faces respective organic light-emitting diodes of the plurality of organic light-emitting diodes, and
a color filter layer disposed between the second substrate and the quantum-dot thin-film layer,
wherein the quantum-dot thin-film layer and the color filter layer color a monochromatic light generated by the plurality of organic light-emitting diodes into red, green or blue light, respectively.

* * * * *